United States Patent [19]

DenBeste et al.

[11] Patent Number: 4,558,422
[45] Date of Patent: Dec. 10, 1985

[54] DIGITAL SIGNAL SAMPLING SYSTEM WITH TWO UNRELATED SAMPLING TIMEBASES

[75] Inventors: Steven C. DenBeste, Beaverton; Douglas G. Boyce, Aloha; John D. Blattner, Beaverton; Kenneth K. Hillen, Aloha, all of Oreg.

[73] Assignee: Tektronix, Inc., Beaverton, Oreg.

[21] Appl. No.: 478,608

[22] Filed: Mar. 23, 1983

[51] Int. Cl.[4] .............................................. G06F 15/20
[52] U.S. Cl. .................................. 364/480; 340/146.2; 364/179; 364/481; 375/106
[58] Field of Search ............... 364/179, 480, 481, 728; 371/20; 340/658, 146.2; 324/76 R, 77 G; 375/96, 106, 110

[56] References Cited

U.S. PATENT DOCUMENTS

| | | | |
|---|---|---|---|
| 3,660,647 | 5/1972 | Pryor, Jr. | 364/728 |
| 4,053,708 | 10/1977 | Hotchkiss | 375/106 |
| 4,285,046 | 8/1981 | Henry | 364/728 |
| 4,355,368 | 10/1982 | Zeidler et al. | 364/728 |
| 4,425,643 | 1/1984 | Chapman et al. | 371/20 |
| 4,426,713 | 1/1984 | Shimizu et al. | 375/106 |
| 4,430,722 | 2/1984 | Massen et al. | 364/728 |

Primary Examiner—Errol A. Krass
Assistant Examiner—Kevin J. Teska
Attorney, Agent, or Firm—John D. Winkelman; George T. Noe

[57] ABSTRACT

A digital signal sampling system is disclosed for reconstructing the time relationship of digital data signals sampled by two sampling clock signals with different unrelated timebases. The digital data signals sampled may be the same data signal or two different data signals sampled simultaneously in two separate sampler circuits at two different unrelated sampling clock frequencies or timebases to produce first and second sampled data signals. A timebase correlation circuit produces first and second time correlation signals in the form of binary level signals in response to the receipt by a last clock pulse detector of first and second store clock signals which are derived from first and second sampling clock signals. The time correlation signals indicate by their binary level the source of the last previous clock pulse of the first and second store clock signals which was received by the timebase correlation circuit. The timebase correlation signals and the first and second sampled data signals are stored in two acquisition memories connected to such sampler circuits, and are read out of the memories and together with a last clock pulse output of the correlation circuit are applied to a data signal reconstruction means including a digital computer which is programmed to reconstruct the digital data signals in time relationship and to display the reconstructed data signals on a cathode ray tube or other display device.

20 Claims, 17 Drawing Figures

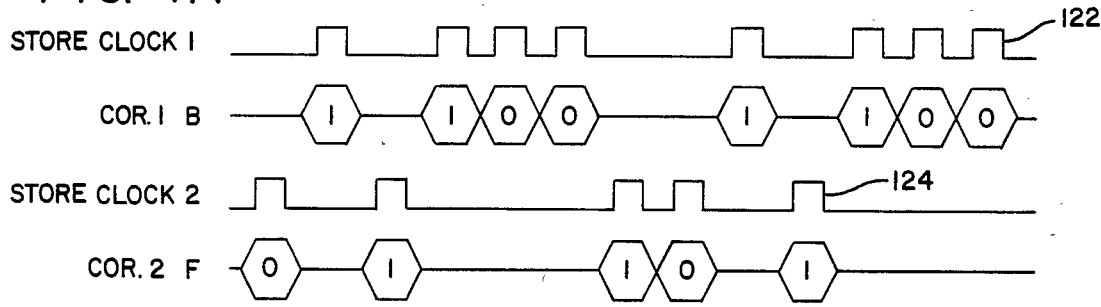
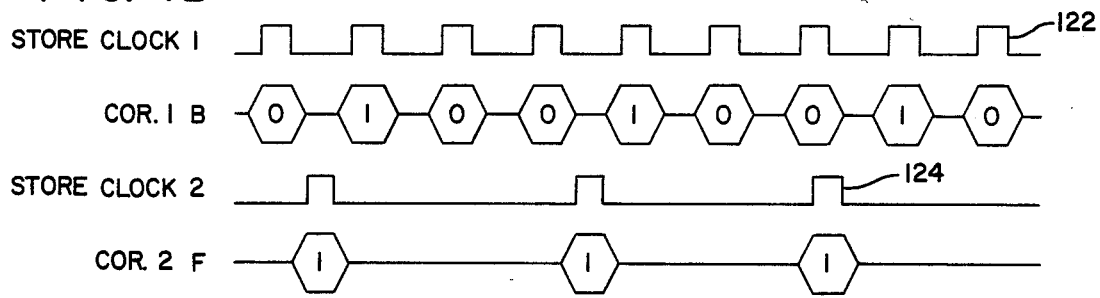
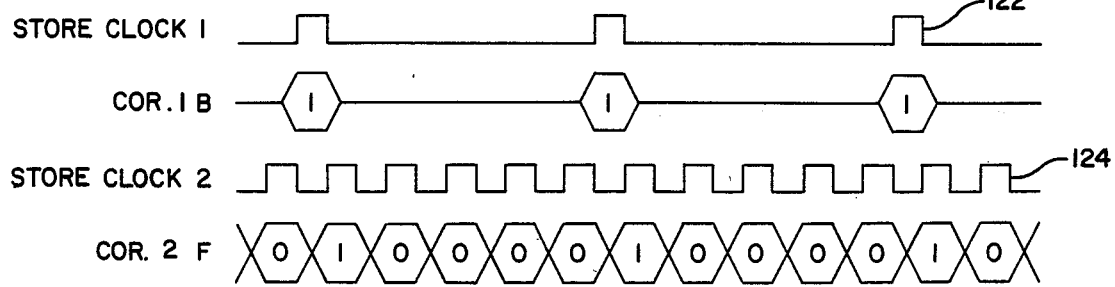

DIGITAL SIGNAL SAMPLING SYSTEM WITH TWO UNRELATED SAMPLING TIMEBASES

BACKGROUND OF THE INVENTION

The present invention relates generally to data signal acquisition systems, and in particular to digital data signal sampling systems with two different sampling clock signals of unrelated frequencies or sampling timebases, including time correlation signal generation means for identifying the last previous clock pulse, and data reconstruction means for reconstructing the sampled digital data signals in proper time relationship for display on a cathode ray tube or other suitable display device.

The digital signal sampling system of the present invention is especially useful in a logic analyzer instrument, but is also useful in other digital signal measurement instruments such as digital oscilloscopes. In a logic analyzer the same or two different digital data signals are sampled simultaneously by two sampling clock signals which may be of different timebases. In order to reconstruct the sampled data signals in their original real time relationship when sampling with two different timebases, it has been proposed to synthesize a common synchronous clock signal from the two different sampling clock signals. Such a common clock signal will, under most conditions, enable proper sampling for data acquisition from both digital data signals. However, this is not true under all conditions and has the disadvantage that it produces large quantities of irrelevant sampled data which must be sorted through to find the relevant sampled data, thereby requiring large memory storage capability which is expensive and inefficient.

Another technique is employed in U.S. Pat. No. 4,425,643 issued to David D. Chapman and Gerd H. Hoern entitled "Multi-Speed Logic Analyzer" to provide a logic analyzer with two different sampling timebases for measuring the same or two different digital data input signals including a high frequency and a low frequency sampling clock signal. The low frequency clock is stored and transmitted as a time reference to the computer for reconstruction of the sampled data signals. However, the high frequency clock signals must be maintained at least twice the frequency of the low frequency clock signals during sampling for accurate reconstruction of the sampled data signals in their correct real time relationship. Thus, if the frequency of the sampling clock signals changes during sampling so that the high frequency clock signal becomes lower in frequency than the low frequency clock signal, inaccuracies are produced in the reconstructed digital data signal using such logic analyzer system.

The digital signal sampling system of the present invention overcomes these disadvantages by employing a time correlation circuit which produces two time correlation signals of different binary levels to indicate the last previous clock pulse received thereby in response to the application of two store clock signals derived from the two sampling clock signals of different unrelated timebases. These time correlation signals are stored in the acquisition memories along with the sampled data, to indicate by their binary logic levels the time relationship of the clock pulses in first and second store clock signals and the first and second sampling clock signals. Thus, the first time correlation signal has a binary "1" level if there is a clock pulse of the second store clock signal between the current and previous clock pulses of the first store clock signal, and has a "0" level if there is no clock pulse of the second store clock signal between the current and previous clock pulses of the first store clock signal. Similarly, the second time correlation signal has a "1" level if there is a clock pulse of the first store clock signal between the current and previous clock pulses of the second store clock signal, and has a "0" level if there is is no clock pulse of the first store clock signal between the current and previous clock pulses of the second store clock signal. These first and second correlation signals together with the corresponding first and second digital data sample signals are stored in first and second acquisition memories when the store clock pulses are applied to such memories. The stored data signals and correlation signals are read out of the memory and together with a last clock pulse output of the correlation circuit are applied to a data signal reconstruction such as a digital computer which is programmed to reconstruct from such signals the sampled digital data signals in proper real time relationship and to display the reconstructed signals on a cathode ray tube or other display device.

SUMMARY OF INVENTION

It is one object of the present invention to provide an improved data signal sampling system of greater accuracy and versatility for sampling analog or digital data signals employing two different unrelated sampling clock timebases.

Another object of the invention is to provide such a sampling system including a timebase correlation means for generating first and second time correlation signals which indicate the last previous clock pulse applied thereto corresponding to the two different unrelated sampling clock timebases to enable correct reconstruction of the sampled data signals in the original time relationship of such data signals.

A further object of the invention is to provide such a sampling system for more accurately reconstructing the sampled digital data signals in which the first and second time correlation signals are produced by the correlation means with different binary logic levels to indicate the last previous clock pulse, including a first correlation signal having a "1" level if there is a clock pulse and a "0" level if there is no clock pulse in the second store clock or sampling clock signal corresponding thereto between the current and previous clock pulses of the first store clock or sampling clock signal corresponding thereto and including a second correlation signal having a "1" level if there is a clock pulse and a "0" level if there is no clock pulse in the first store clock signal, or sampling clock signal corresponding thereto between the current and previous clock pulses of the second store clock signal or sampling clock signal corresponding thereto.

An additional object of the invention is to provide such a sampling system having the ability to reconstruct the sampled digital data signals with their original time relationship using two different unrelated sampling signal timebases without regard to their frequencies or the need for one timebase to always be of higher frequency than the other timebase by a minimum amount.

Still another object of the invention is to provide such a digital signal sampling system in which a data reconstruction means is employed for reconstructing the digital data signals in proper time relationship from first and second sampled data output signals stored in first and second memory means, from first and second correlation signals corresponding to the last previous clock pulse of first and second sampling clock signals of different unrelated timebases also stored in such memory means, and from a last clock pulse signal produced by the timebase correlation circuit means.

A still further object of the invention is to provide a signal acquisition system employing such a digital signal sampling system in which the data reconstruction means includes a digital computer and associated program memory means containing a computer program stored therein for reconstructing the digital data signals and for displaying the reconstructed signals on a display means such as a cathode ray tube.

DRAWINGS

Other objects and advantages of the present invention will be apparent from the following detailed description of a preferred embodiment thereof and from the attached drawings of which:

FIGS. 4A, 4B and 4C are timing diagrams showing the time correlation signals produced in the correlation circuit of the system of FIG. 1 for clock signals of different relative frequency;

FIGS. 5A, 5B, 5C, 5D, and 5E are flow charts of the steps of a first computer program for operating one embodiment of the invention; and FIGS. 6A, 6B, 6C, 6D, and 6E are flow charts of the steps of a second computer program for operating another embodiment of the invention.

DETAILED DESCRIPTION OF PREFERRED EMBODIMENT

Figure 1:
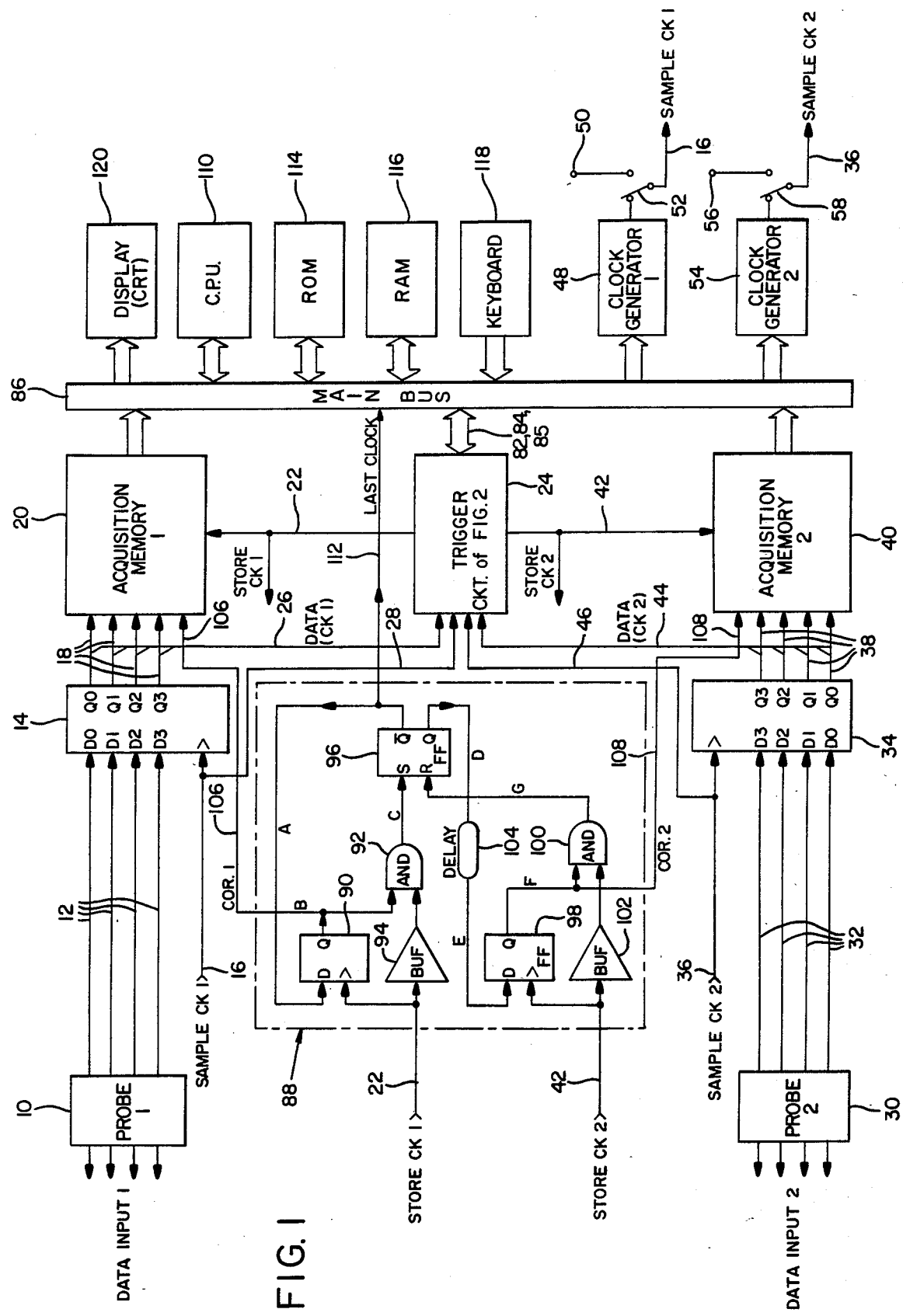
FIG. 1 is a block diagram and partial schematic circuit diagram of the electrical circuit of one embodiment of the digital signal sampling system of the present invention.

As shown in FIG. 1, one embodiment of the digital data sampling system of the present invention may be employed in a logic analyzer with a first analyzer section, including a first probe 10 having four or more input terminals connected to a digital data signal source to transmit such data signal over four or more parallel data input lines 12 to a first data sampler flip-flop circuit 14 connected to such lines at data inputs D0, D1, D2 and D3. A first sampling clock signal is applied through sample clock conductor 16 to the clock input of the first data sampler 14, each sampling clock pulse causing such data sampler to take a sample of each of the digital data signals applied to data input lines 12, and to produce corresponding sampled data output signals on four data output lines 18 connected to output terminals Q0, Q1, Q2 and Q3 of such sampler. The sampled data output signals are fed through the output lines 18 to a first acquisition memory 20 and stored in such memory when a first store clock signal is applied to a store clock input conductor 22 connected to such memory. The first store clock signal at clock input 22 is produced at one output of a trigger circuit 24 in response to the receipt of first sampled digital data output signals on a common data input 26 of such trigger circuit and in response to the first sample clock pulses applied to input 28 of such trigger circuit, in a manner hereafter discussed with reference to FIG. 2. This completes the description of the first analyzer section.

Figure 2:
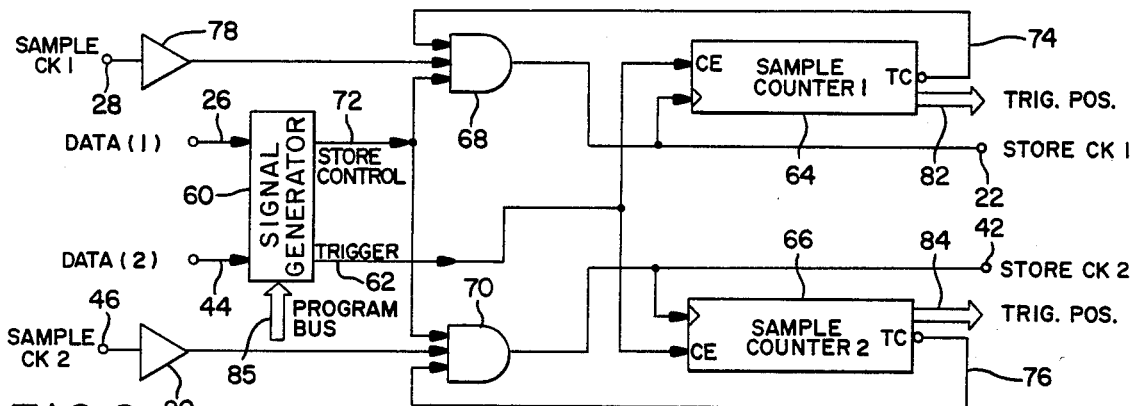
FIG. 2 is a schematic circuit diagram of the electrical circuit of the trigger generator and storage clock generator circuit in the system of FIG. 1.

A second analyzer section includes a second probe 30 having four or more inputs connected to a second digital data signal source which may be a separate signal source or the same signal source as the first digital data signal source applied to the inputs of probe 10. The second probe is connected through four data input lines 32 to the data inputs D0, D1, D2 and D3 of a second data sampler flip-flop 34. A second sampling clock signal is applied through a clock conductor 36 to the clock input of the second sampler 34 to cause it to sample the second data signals and to produce corresponding sampled second data output signals on four data output lines 38 at data outputs Q0, Q1, Q2 and Q3 of the second sampler. These second sample data outputs 38 are connected to the inputs of a second acquisition memory 40 to which is also applied a second store clock signal output 42 of trigger circuit 24 causing such memory to store the second sampled data. The second sampled data outputs 38 are also connected in common to a second sampled data input 44 of the trigger circuit 24 and the second sample clock conductor 36 is connected to a second sample clock input 46 of such trigger circuit to produce the second store clock signal in a manner hereafter described as shown in FIG. 2. This completes the second analyzer section.

The first sample clock signal on sampling clock conductor 16 is supplied by a first clock generator 48 or a first source 50 of periodic clock signals selectively connected by a switch 52 to sample clock conductor 16. Similarly, the second sample clock signal on sample clock conductor 36 is supplied by a second clock generator 54 or to a second source of periodic clock pulses 56 selectively connected by a switch 58 to the sample clock conductor 36. The first and second clock generators 48 and 54 produce first and second clock signals, respectively, of different and unrelated frequencies or timebases which need not be periodic signals and may be changed under the control of a data processor C.P.U. connected to the main bus 86. The first and second sampling clock signals applied to clock source terminals 50 and 52 may also be of different and unrelated frequencies, and need not be of a known periodic frequency.

The electrical circuit of trigger circuit 24 is shown in FIG. 2 and includes a signal generator circuit 60 having two inputs, one connected to the first sampled data input 26 and the other connected to the second sampled data input 44. Signal generator 60 is of a known type, and suitably includes one or more word recognizers and other qualifying circuitry for defining, under program control, specific triggering and store control signal events. Generator 60 produces a trigger signal at output 62 when, on the basis of the first sampled data signal on input 26 and the second sampled data signal on input 44, a defined triggering event occurs. The trigger output 62 is applied to the count enable (CE) inputs of a first sample counter 64 and a second sample counter 66 to clear such counters and to enable them to begin counting clock pulses when such clock pulses are applied to their clock inputs which are connected to the outputs of AND gates 68 and 70, respectively. The AND gates 68 and 70 each have one input connected to a store control signal output 72 of the signal generator circuit 60. The store control signal is produced when a store event is recognized on the basis of the first and second sampled data signals at inputs 26 and 44. Another input of each of the AND gates 68 and 70 is connected to the terminal count (TC) outputs 74 and 76 of sample counters 64 and 66, respectively, which is produced at the end of the count when such counters reach a desired, preprogrammed termination count. The third input of each of the AND gates 68 and 70 is connected, respectively, to the first sample clock signal input 28 and the second sample clock input 46 through buffer amplifier stages 78 and 80, respectively. Thus, when the store control signal is produced at output 72 of generator circuit 60, it turns on the AND gates 68 and 70 and allows such gates to transmit the first and second sample clock pulses applied thereto through such gates to the counters 64 and 66, and to the outputs 22 and 42 as first and second store clock signals. As a result, the first and second sample counters 64 and 66 begin to count the sample clock pulses as soon as the trigger pulse output 62 is applied thereto. After a predetermined number of sample clock pulses has been counted by the sample counters 64 and 66 equal to their predetermined count capacity, they produce at terminal count outputs 64 and 66 gate off pulses which turn off the AND gates 68 and 70. It should be noted that the sample counters 74 and 76 do not begin counting until such counters are cleared and enabled by application of the trigger signal output 62, and they count at different rates in accordance with the different frequencies of the first and second sample clock signals.

The time position of the trigger signal relative to the actual running count of the counter is indicated by a trigger position indicator signal at TPI bus outputs 82 and 84 of the sample counters 64 and 66. This is important when the sample clock signal is interrupted before the end of the count so that the counter does not produce a terminal count signal at the TC output. The trigger position indicator signals at bus outputs 82 and 84 are applied to a main bus 86 which is connected to a data processor C.P.U. 110 in a manner hereafter described. The main bus also applies control signals through a program bus 85 to the signal generator 60 of the trigger circuit 24 in order to change the specific qualifying events programmed therein which must be recognized before a trigger pulse or a store control signal is produced at outputs 62 and 72. The main bus 86 is also connected to the outputs of the acquisition memories 20 and 40 for receiving the data signals and time correlation signals stored therein, and to the clock generators 48 and 54 for changing the clock signal frequency or other characteristics.

The timebase correlation circuit 88 includes a first correlation sampler flip-flop 90 having its clock input connected to the first store clock signal input 22, and having its Q data output connected to one input of a first AND gate 92. The other input of the AND gate is connected to the first store clock input 22 through a first buffer amplifier 94. The output of the AND gate 92 is connected to the set inputs of a last clock detector flip-flop 96 whose $\bar{Q}$ data output is connected to the D data input of the first correlation sampler flip-flop 90.

A second correlation sampler flip-flop 98 is provided with its clock input connected to the second store clock signal input 42 and its Q data output connected to one input of a second AND gate 100. The other input of the AND gate 100 is connected through a second buffer amplifier 102 to the second store clock input R42. The output of AND gate 100 is connected to the clear input of the last clock detector flip-flop 96. The Q data output of the last clock detector flip-flop 96 is connected through a digital delay circuit 104 to the data input of the second correlation sampler flip-flop 98. The flip-flops 90, 96 and 98 may be integrated circuits of type MC10H131 manufactured by Motorola, Inc. of Phoenix, Ariz. The AND gates 92 and 100 and the buffer amplifiers 94 and 102 may be integrated circuits of type MC10H104, also, manufactured by Motorola, Inc. It should be noted that in order to form the buffer amplifier, one of the AND gates of integrated circuit MC10H104 has its two inputs tied together. The delay circuit 104 is any suitable digital signal delay circuit which provides approximately three nanosecond delay in the feedback of the signal from the Q output of the last count detector flip-flop 96 to the data input of flip-flop 98 to prevent last count detector flip-flop from being cleared by the second store clock until it has been set by the first store clock. Within the last clock detetor 96 the set input, S, will override the clear input, R, in the event of collision of the clock signals so that the first store clock signal has been assigned precedence over the second store clock signal. The three nanosecond delay of the delay circuit 104 in the second correlation sampler flip-flop data input path prevents detection of the first clock signal applied to the set input of the last clock detector flip-flop so soon after the previous set input that the second clock signal applied to the clear input of flip-flop 96 is overridden, as it would ordinarily tend to do in the event of coincidence of these two clock signals. Thus, since the flip-flop 96 has not yet been reset by the clear signal, it cannot be set by such next set input. In this way the clear signal provided by the second store clock pulse is not lost by being overridden by the set input provided by the first store clock pulse. As a result, the time correlation signals, B and F, produced on lines 106 and 108 at the Q outputs of the correlation sampler flip-flops 90 and 98 and the last clock indicator signal, A, produced at the $\bar{Q}$ output of the last clock detector flip-flip 96 are more accurate.

A first time correlation signal is produced at the Q data output of the first correlation sampler 90 and is applied to the correlation signal input 106 of the acquisition memory 20 for storage. A second time correlation signal is produced at the Q data output of the second correlation sampler flip-flop 98 and is applied to the correlation signal input 108 of the second acquisition memory 40. The first and second time correlation signals are binary level signals whose levels change between "0" and "1" in a predetermined manner to indicate the last previous clock pulse of the first store clock signal and the second store clock signal detected by the last clock detector flip-flop 96. Since the first and second store clock signals at inputs 22 and 42 are related to the first and second sampling clock signals at inputs 16 and 36, the time correlation signals produced at outputs 106 and 108 are also related to such sample clock signals. Thus, the time correlation signals also indicate the time relationship of the first and second sampling pulses as they are applied to the clock inputs of the first and second data samplers 14 and 34.

The first and second time correlation signals at outputs 106 and 108 of the timebase correlation circuit 88 are stored in the acquisition memories 20 and 40 for later application to the main bus 86 connected to the output of such memories. These time correlation signals together with the sampled digital data signals also stored in memories 20 and 40 enable reconstruction of the sampled data signal by the data processing means including a central processing unit 110 of a digital computer, such as Intel type 8088 microprocessor. In addition, a last clock indicator signal produced at the $\overline{Q}$ output of the last clock detector flip-flop 96 is applied through last clock output conductor 112 to the bus 86 for use by the computer 110 to reconstruct the sampled digital data signals.

A program memory 114 of the read-only memory (ROM) type is connected through the main bus 86 to the computer 110 for controlling the operation of such computer in accordance with a computer program stored in such memory whose flow charts are shown in FIGS. 5A–5D and 6A–6D. A data memory 116 of the random access (RAM) type is also connected through the main bus 86 to the computer 110 for storing the sampled data, correlation signals, last clock indicator signal, address signals and other control signals so that such signals may be processed by the computer. A keyboard input terminal 118 is also connected through the data bus 86 to the computer 110 for changing or adding program information, such as the trigger and store control event qualifiers applied through program bus 85 to the signal generator 60 in the trigger circuit 24. The computer 110 is connected to a display device 120, such as a cathode ray tube, which may be operated as a television monitor driven by horizontal and vertical raster scan signals and using intensity modulation of the electron beam spot by the data signals to form a display image of the reconstructed data signals supplied thereto by the computer.

Figure 3A:
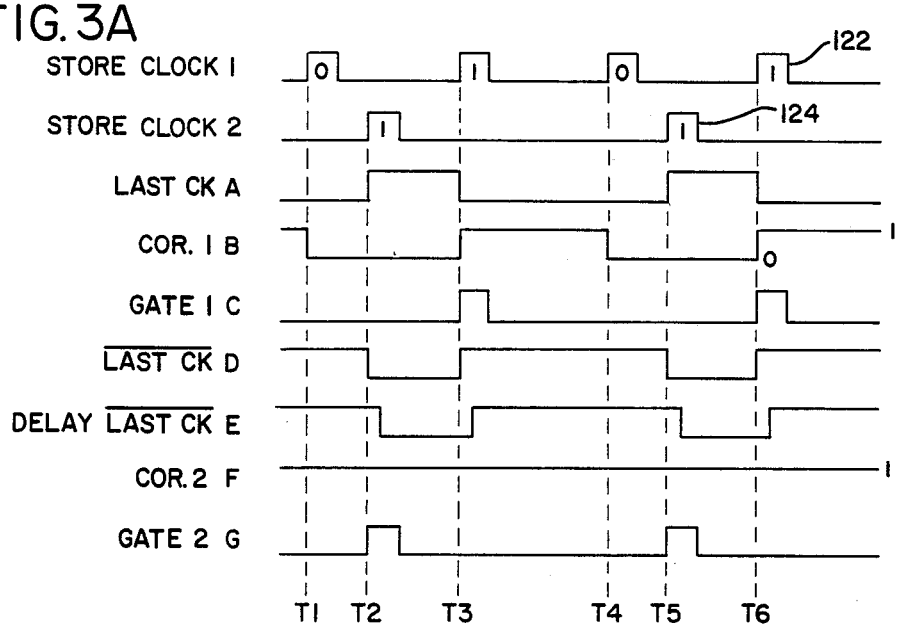
FIGS. 3A and 3B are timing diagrams showing electrical signals produced in the circuits of FIGS. 1 and 2 on the same time scale but using two different sampling clock timebases.
Figure 3B:
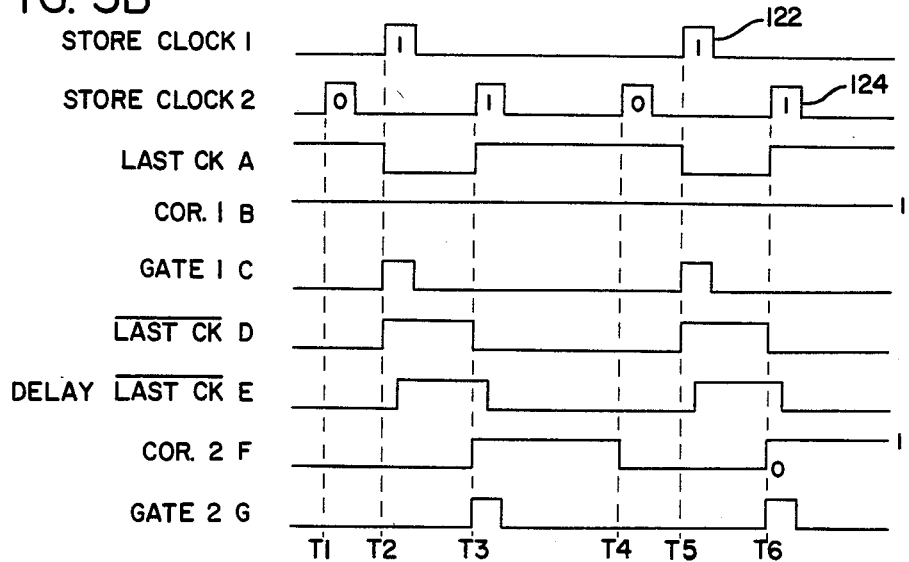

The operation of the timebase correlation circuit 88 will be further explained in reference to FIGS. 3A and 3B which show the signals produced in such circuit on the same time axis. Thus, in FIG. 3A a first store clock signal 122 of high frequency is applied to clock input 22 while a second store clock signal 124 of lower frequency is applied to clock input 42. The first pulse of the first store clock signal 122 switches the first correlation sampler flip-flop 90 to cause its Q output signal B which is the first time correlation signal, to change downward from a "1" binary level to a "0" binary level at time T1. This switching of correlation sampler 90 is enabled because such correlation sampler had previously received at its D input a last clock indicator signal A of "0" level produced at the $\overline{Q}$ output of the last clock detector flip-flop 96. However, the first pulse of the store clock signal 122 is not transmitted through AND gate 92 because the other input of such gate is held at 0 by the changed state of first correlation signal B. The next clock pulse received at time T2 is the first pulse of the second store clock signal at input 42 which is applied to the second correlation sampler flip-flop 98, but does not switch such flip-flop since its data input D is at a "1" state. As a result, the second time correlation signal F produced at the Q output remains at a binary "1" level. However, the second store clock signal passes through the buffer 102 and the AND gate 100 as gate 2 output signal G to the clear input of the last circuit detector 96 because the other input of such AND gate is held in a high position corresponding to a "1" level of the second time correlation signal F. As a result, the first pulse of the second store clock switches the last clock detector flip-flop 96 to cause an inverted last clock indicator signal D to be produced on Q data output signal D of such flip-flop which falls from a "1" to a "0" state at time T2 and at the same time causing the last clock indicator output signal A at the Q output of such flip-flop to rise from a "0" level to a "1" level. Note, that the inverted last clock indicator signal D is delayed by the delay circuit 104 to provide the delayed inverted last clock signal E which after a delay of 3 nanoseconds after T2 switches from a "1" level to a "0" level, thereby enabling the second correlation sampler flip-flop 98 to be triggered by the next occurring second store clock pulse. However, this triggering does not happen because the state of such second correlation sampler flip-flop 98 is changed again back to a "1" level by the receipt of a first storage clock pulse on input 22 at time T3 which is transmitted through AND gate 92 to switch the last count detector 96 and produce a change in the inverted last clock signal D and the delayed signal E from "0" to "1". Thus, when the second pulse of the first store clock signal 122 occurs at time T3, it switches the first correlation sampler flip-flop 92 and causes the first correlation signal B on its Q output to change from a "0" to a "1" because at this time its D data input is also changed from the level "1" to the "0" level of the last clock indicator signal A applied thereto in the manner hereafter described. At the same time, the second pulse of the first store clock signal is transmitted through the AND gate 92 as gate 1 signal C because the other input of such AND gate is now at a "1" level due to the switching of the first time correlation signal B to such level. As a result, the first store clock signal 124 is applied to the set input of the last clock detector flip-flop 96 and switches such flip-flop to change the last clock indicator signal A on its Q output from a "1" to a "0" level and to change its inverted last clock indicator output signal D at its Q output from a "0" level to a "1" level. The last clock indicator signal A is fed back to the first correlation sampler flip-flop 90 and switches such flip-flop to produce the "0" to "1" change in the first correlation signal B. Similarly, the inverted last clock indicator signal D is transmitted through delay 104 as a delayed inverted last clock indicator signal E which changes from a "0" to a "1" level and holds the second correlation sampler flip-flop 98 in its switched condition to maintain the second time correlation signal F at a "1" level.

It should be noted in FIG. 3A that at the lead edge of the first store clock pulses 122 the first time correlation signal B changes from level 1 to level 0 at time T1, returns to level 1 at time T3, again falls to level 0 at time T4 and finally changes from 0 to level 1 at time T6. However, the second time correlation signal F is maintained at level 1 during the entire time period. Thus, the first time correlation signal indicates the time of occurrence of the pulses of the first store clock signal as follows: the first pulse has a 0 correlation level, the second pulse has a 1 correlation level, the third pulse has a 0 correlation level and the fourth pulse has a 1 correlation level. Similarly, the occurrences of the pulses of the second store clock signal 124 are indicated by the first pulse having a 1 correlation level and the second pulse having a 1 correlation level.

The timebase correlation circuit 88 produces first correlation signal B and second correlation signal F with binary levels corresponding to the alogrithm of the computer program stored in the program memory 114 is in accordance with the following four rules. Rule 1—The first correlation signal B has a "1" level if there is a clock pulse of the second store clock signal 124 located between the current and previous clock pulses of the first store clock signal 122. Rule 2—The first correlation signal B has a "0" level if there is no clock pulse of the second store clock signal 124 located between the current and previous clock pulses of the first clock signal 122. Rule 3—The second correlation signal F has a "1" level if there is a clock pulse of the first store clock signal 122 between the current and previous clock pulses of the second clock signal 124. Rule 4—The second correlation signal F has a "0" level if there is no clock pulse of the first store clock signal 122 between the current and previous clock pulses of the second store clock signal 124. It should be noted that the "1" level and the "0" level designations in the above rules are arbitrary and can be reversed without changing the application of the rules.

FIG. 3B shows a signal timing diagram similar to FIG. 3A except that the second store clock signal 124 is of higher frequency than the first store clock signal 122, so that the first time correlation signal B stays at a 1 level while the second time correlation signal F changes levels. The second time correlation signal raises from an initial 0 level to a 1 level at time T3 when the second pulse of the second store clock signal is received, drops from a 1 level to a 0 level at time T4 when the third pulse of the second store clock signal is received, and finally raises from a 0 level to a 1 level at time T6 when the fourth pulse of the second store clock signal is received. Thus, the time correlation values for the first store clock signal of FIG. 3B are a "1" for the first pulse and a "1" for the second pulse, while the time correlation values of the second store clock signal are a "0" for the first pulse, a "1" for the second pulse, a "0" for the third pulse and a "1" for the fourth pulse.

FIGS. 4A to 4C show the time correlation signals B and F for three different timebase relationships between the first store clock signal 122 and the second store clock signal 124. In the timing diagram of FIG. 4A the first store clock signal is non-periodic, and is generally of a higher frequency than the second store clock signal 124 which is also non-periodic. Thus, when applying the above described algorithm to the condition of FIG. 4A, the first time correlation signal B is at a 1 level for the first clock pulse of the first store clock signal because there is a second store clock pulse between the current clock pulse and the previous clock pulse of the first store clock signal. This first correlation level of "1" is also true for the second, fifth and sixth pulses of the first store clock signal. Similarly, the second, fourth, seventh and eighth clock pulses of the first store clock signal have a 0 level in the first correlation signal because in FIG. 4A there is no clock pulse of the second store clock signal between the current and previous clock pulses of the first store clock signal. Thus, since there is no clock pulse of the second store clock signal 124 between the second and third pulses, between the third and fourth pulses, between the sixth and seventh pulses or between the seventh and eighth pulses of the first store clock signal 122, the correlation values for the third, fourth, seventh and eighth pulses is 0. A similar explanation can be made for the changes in correlation levels of the second time correlation signal F.

FIGS. 4B and 4C show the changes in the time correlation signal levels under two different conditions for periodic store clock signals. Thus, FIG. 4B applies to the condition in which the frequency of the first store clock signal 122 is greater than that of the second store clock signal 124 and both signals are periodic. This is similar to the condition of FIG. 3A in which the second time correlation signal F is always at a "1" level. However, FIG. 4C applies to the condition in which the frequency of the second store clock signal 124 is greater than that of the first store clock signal 122 and both signals are periodic. This is similar to the condition of FIG. 3B in which the first time correlation signal B is always at a "1" level.

The computer programs for the digital signal sampling system are shown in FIGS. 5 and 6 which each use the first and second correlation signals B and F from each store clock timebase, plus the last clock indicator signal at 112 which tells which store clock timebase was received last, to reconstruct the time relationships of the sampled data timebases.

There are actually two different computer program algorithms given here. One is the simple generic case shown in FIGS. 5A to 5E, the other a slightly modified one shown in FIGS. 6A to 6E.

Consider the following Example 1 for two data input signals to the logic analyzer, where "T1" and "T2" are the first and second store clocks or timebases 122 and 124, "T1 cor" and "T2 cor" are the first and second time correlation signals B and F, and "T1 data" and "T2 data" are the first and second data input signals which are produced by the same pulse counter:

```
T1      ⎯  ⎯  ⎯  ⎯     ⎯    ⎯  ⎯  ⎯
T1 cor  1  1  0  0     1    1  0  0
T1 data 2  4  5  6     9    B  C  D T2         ⎯  ⎯              ⎯  ⎯  ⎯
T2 cor     0  1              1  0  1
T2 data    1  3              7  8  A
```

This example represents two different sections of a logic analyzer both looking at the same data source counter, but sampling the output of that counter with different timebases. In this particular example, the data is chosen as counts of the same counter to make it visually obvious if the reconstruction is right. In the general application, no judgment can be made from the data itself—the software must base its reconstruction solely on the data provided by the correlation circuit.

When software reads the above data back from the hardware, the following table of values is found and the two columns under where T1 and T2 are the values for the first and second store clock signals, respectively. The first number in each line is the sampled data and the second number within the parenthesis is the correlation signal level:

| T1 | T2 |
|---|---|
| 2(1) | 1(0) |
| 4(1) | 3(1) |
| 5(0) | 7(1) |
| 6(0) | 8(0) |
| 9(1) | A(1) |
| B(1) | |
| C(0) | |
| D(0) | |

Also the last clock indicator signal on output 112 indicates that T1 was the last data timebase to have a valid stored cycle as shown above in T1 data by count "D".

The algorithms presented in the two flow charts of FIGS. 5 and 6 both make the following assumptions. There are three data collection structures or memory sections in the computer data memory 116, and a pointer into each. One of the data structures is the T1 data read from the accumulation memory 20 into such structure, and each entry in that structure is one sample of data for all channels assigned to T1, plus the correlate signal information for the sample for T1. The pointer into that structure is called T1 INTPR. Likewise, for the T2 data structure (where each entry is one sample of data for all channels on T2 plus the correlate signal information for T2 on that sample) the pointer is called T2 INPTR. The third data structure is the reconstructed or output data which is displayed on the screen of the display device 120 for the user. The pointer into that output data structure is called OUTPTR. Each location of that structure contains an entry for every channel in the instrument regardless of timebase. Each entry for each channel for a given location in this structure has the capability of representing all of the possible level values that channel could have sampled. On a logic analyzer currently, this usually is "1", "0" and "GLITCH", though in the future other values such as "TRI-STATE" might also be represented plus a special value called "NO DATA". If an entry for a given channel in a given location contains "NO DATA" then it is displayed as a blank on the display screen. Initially the data memory 116 is set so that every location in the output memory is "NO DATA". The algorithm then fills selected locations in the memory with other values. All locations that are not altered remain "NO DATA" and are therefore displayed as blank.

When the algorithm in FIGS. 5A to 5E are applied to the above data example, the resulting reconstructed data for timebases T1 and T2 is as follows:

| T1 | T2 |
|----|----|
| —  | 1  |
| 2  | —  |
| —  | 3  |
| 4  | —  |
| 5  | —  |
| 6  | —  |
| —  | 7  |
| —  | 8  |
| 9  | —  |
| —  | A  |
| B  | —  |
| C  | —  |
| D  | —  | where the dashes represent gaps (i.e. actually blanks) when displayed. These are locations which were initialized to "NO DATA" and were never changed by the algorithm. This reproduction accurately reproduces the true relationships of the timebases of the sampled data when they were sampled, especially if they are very unusual timebases such as were used in this example.

However, a more common use of this system would be where one of the timebases is much faster than the other as given in the following example 2:

```
T1      ─   ─   ─   ─   ─   ─   ─   ─   ─   ─   ─
T1 COR  0   0   1   0   0   1   0   0   1   0   0
T1 DATA 1   2   4   5   6   8   9   A   C   D   E

T2      ───         ───         ───
T2 COR      1           1           1
T2 DATA     3           7           B
```

Again, the last clock indicator signal at 112 will report that T1 stored last. The resulting data read from the output memory section of memory 116 will look like the following:

| T1   | T2   |
|------|------|
| 1(0) | 3(1) |
| 2(0) | 7(1) |
| 4(1) | B(1) |
| 5(0) |      |
| 6(0) |      |
| 8(1) |      |
| 9(0) |      |
| A(0) |      |
| C(1) |      |
| D(0) |      |
| E(0) |      |

When the algorithm in flow chart of FIGS. 5A to 5E is used, the reconstructed data stored in the output section of computer data memory 116 looks like the following:

| T1 | T2 |
|----|----|
| 1  | —  |
| 2  | —  |
| —  | 3  |
| 4  | —  |
| 5  | —  |
| 6  | —  |
| —  | 7  |
| 8  | —  |
| 9  | —  |
| A  | —  |
| —  | B  |
| C  | —  |
| D  | —  |
| E  | —  |

Sampled data like this is very likely to be collected when T1 time base used is an asynchronous, and therefore periodic timebase. The problem with the reproduction given above is that the time between the 6 and 8 data count is the same as between the 9 and A data counts. However, the distance between the 6 and 8 data is twice that between 9 and A data. While this is fairly evident in a state display, in a timing diagram this could be very confusing.

As a result, a slightly-modified version of the algorithm is presented in the flow chart of FIGS. 6A to 6E. When the data from the first example in acquisition memories 20 and 40 shown above is reconstructed using the modified algorithm, the following is the result:

| T1 | T2 |
|----|----|
| —  | 1  |
| 2  | 3  |
| 4  | —  |
| 5  | —  |

-continued

| T1 | T2 |
|---|---|
| 6 | 7 |
| — | 8 |
| 9 | A |
| B | — |
| C | — |
| D | — |

This is not much different than the result of using flow chart of FIGS. 5A to 5E, though it does use fewer locations in the reconstructed memory. However, when the data from the second example above is reconstructed using flow chart of FIGS. 6A to 6E, the result is as follows:

| T1 | T2 |
|---|---|
| 1 | — |
| 2 | 3 |
| 4 | — |
| 5 | — |
| 6 | 7 |
| 8 | — |
| 9 | — |
| A | B |
| C | — |
| D | — |
| E | — |

In this reconstructed data memory, the data collected with the asynchronous timebase of T1 is presented densely, that is, without gaps. As a result, the distance on the screen between the 6 and 8 data counts is the same as between the 9 and A data counts, just as it was during acquisition. Each of the two algorithms presented are better than the other under some circumstances, which is why both are presented.

Figure 5A:
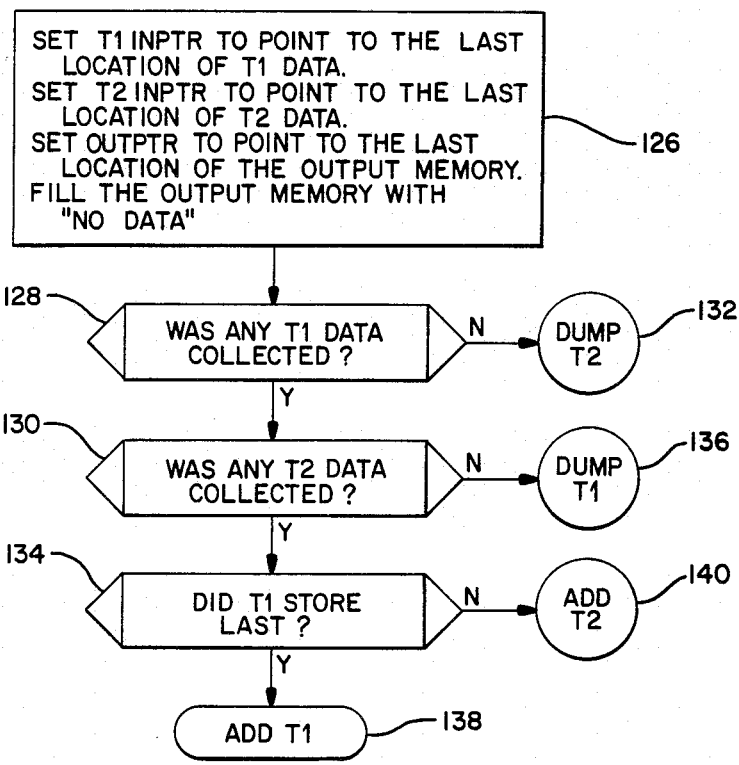

The computer program flow chart shown in FIGS. 5A to 5E includes a first step 126 in FIG. 5A having several commands, the first of which is "Set timebase T1 input pointer to point to the last location of the timebase T1 data." The second command is "Set timebase T2 input pointer to point to the last location of the timebase T2 data." The third command is "Set output pointer to point to last location of the output memory." And finally, the command "Fill the output memory with 'no data'." The commands in step 126 all refer to data stored in the computer data memory 116 after such data has been transferred into such memory from the acquisition memories 20 and 40. The computer data memory 116 contains three memory sections including a T1 timebase memory section, a T2 timebase memory section, and an output memory section. When step 126 is performed, the program proceeds to the second step 128 which asks the question "Was any timebase T1 data collected?", and refers to the first data signal samples stored in the T1 memory portion of computer memory 116. If the answer is YES, the program proceeds to the third step 130. However, if the answer to the question of step 128 was NO, the program proceeds to the "dump timebase T2" step 132. This means that second data signal samples stored in the T2 memory portion of computer memory 116 are all transferred into the output memory section of such computer memory. The third step 130 asks the question "Was any timebase T2 data collected?" If the answer to that question is YES, the program proceeds to the fourth step 134. However, if the answer to the question of step 130 is NO, the program proceeds to a "dump timebase T1" step 136. The fourth step 134 asks the question "Did timebase T1 store last?" If the answer to that question is YES, the program proceeds to an "add T1" step 138. However, if the answer to the question of step 134 is NO, the program proceeds to an "add T2" step 140.

Figure 5B:
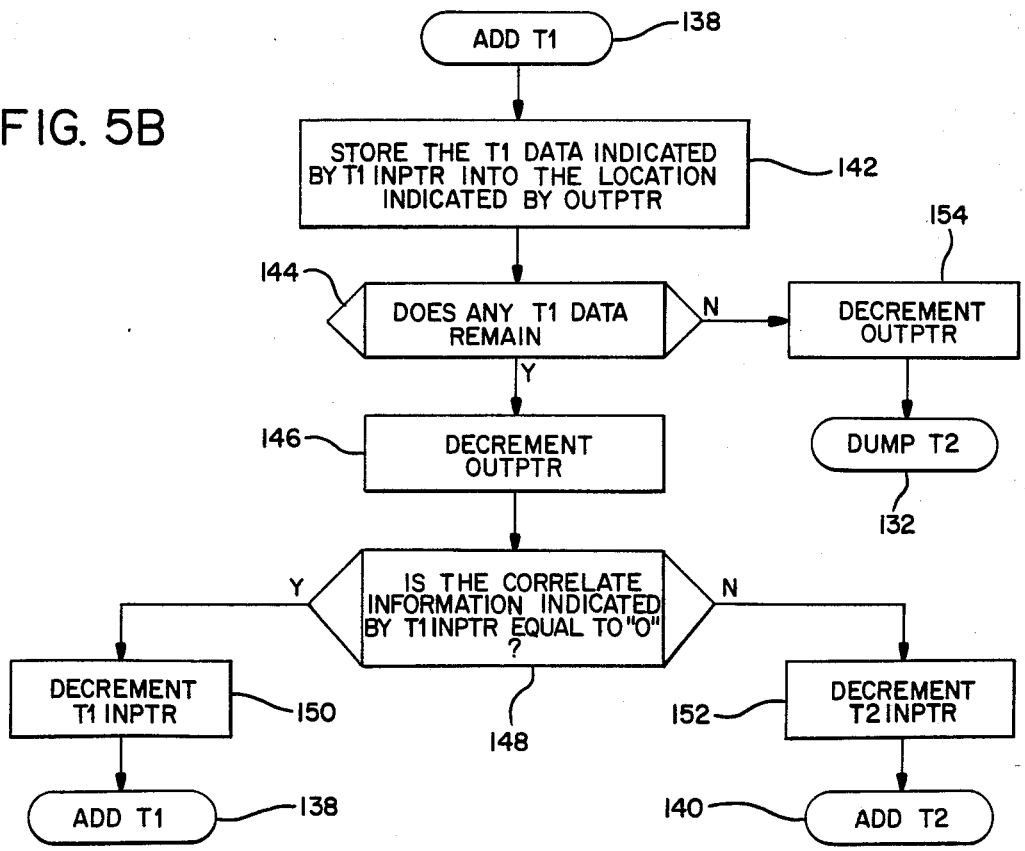

The computer program flow chart proceeds from step 138 of FIG. 5A to FIG. 5B where it advances to a fifth step 142 which contains the command "Store the timebase T1 data indicated by the T1 input pointer into the location indicated by the output pointer." This step refers to movement of the timebase T1 data stored in the T1 memory section of computer memory 116 and indicated by the T1 input pointer into the output memory section of the computer memory at a location indicated by the output pointer. These "pointers" are provided in the computer program software and are used as indexes to indicate data location. After step 142 is completed the program advances to the sixth step 144 which asks the question "Does any T1 data remain?" This question refers to whether or not any first data signal samples remain in the T1 memory section of the computer memory 116. If the answer is YES, then the program proceeds to a "decrement output pointer" step 146 which causes the output pointer to move backward one space in the output memory section of the computer data memory. Then the program proceeds to a seventh step 148 which asks the question "Is the correlated information indicated by the T1 input pointer equal to '0'?" This refers to the binary logic level of the first correlation signal stored in the T1 memory section of the computer memory 116. If the answer to this question is YES, then the program proceeds to the "decrement T1 input pointer" step 150 which moves the Ti memory section input pointer backward one space and then proceeds back to the "add T1" step 138 at the top of FIG. 5B. However, if the answer to the question of step 148 is NO, the program proceeds to the "decrement T1 input pointer" step 152 and then on to the "add T2" step 140. If the answer to step 144 is NO, the program proceeds to the "decrement output pointer" step 154 and then on to the "dump T2" step 132.

Figure 5C:
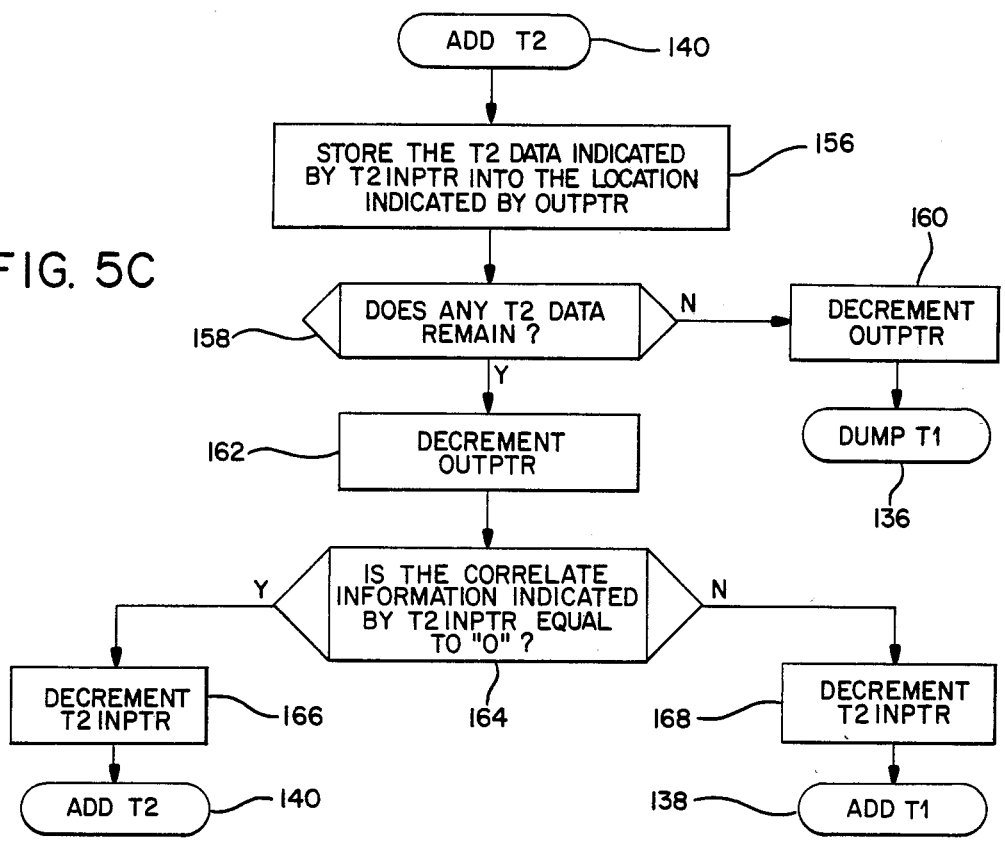

The computer program then proceeds from step 140 of FIG. 5B to program portion shown in FIG. 5C where it advances to step 156 containing the command "Store the T2 data indicated by the T2 input pointer into the location indicated by the output pointer." This command relates to a T2 input pointer indicating the second data signal samples stored in the T2 memory section of the computer memory 116, and transfers such data into the output memory section of such computer memory at a location indicated by the output pointer. After step 156 is completed the program advances to step 158 which asks the question "Does any T2 data remain?" If the answer to this question is NO, the program proceeds to a "decrement output pointer" step 160 and then onto the "dump T1" step 136. If the answer to the question in step 158 is YES, the program proceeds to the "decrement output pointer" step 162 and then to step 164 which asks the question "Is the correlate information indicated by the T2 input pointer equal to '0'?" If the answer to this question is YES, the program proceeds to a "decrement T2 input pointer" step 166 and then to the "add T2" step 140 for return back to the top of FIG. 5C. If the answer to the question in step 164 is NO, the program proceeds to a "decrement T2 input pointer" step 168 and on to the "add T1"

step 138 which is the first step in the computer program portion of FIG. 5B.

Figure 5D:
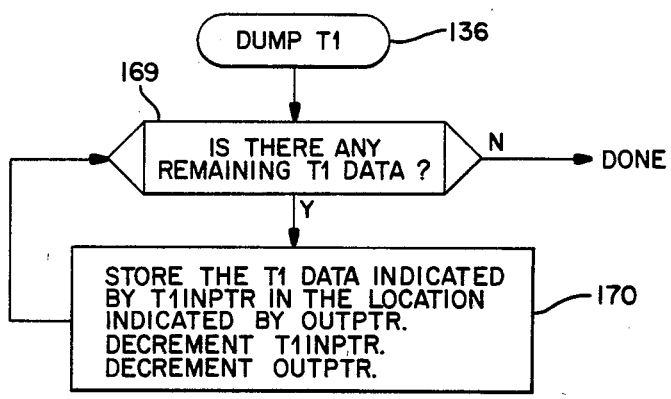
Figure 5E:
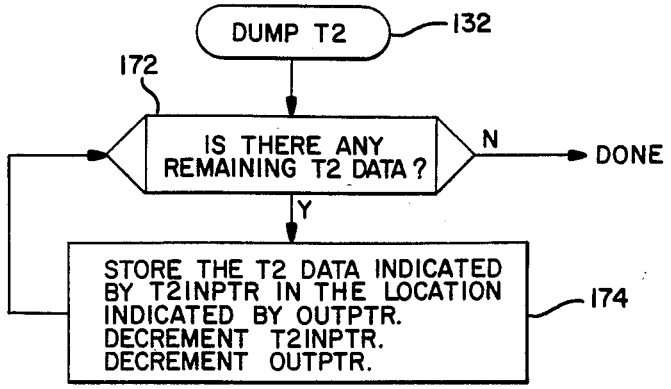

The "dump T1" step 136 portion of the program is shown in FIG. 5D, while the "dump T2" step 132 program portion is shown in FIG. 5E. Thus, after step 136, the program advances to step 169 which asks the question "Is there any remaining T1 data?" If the answer is NO, then the program advances to "done." If the answer to the question is YES, then the program advances to step 170 which contains the command "Store the T1 data indicated by the T1 input pointer in the location indicated by the output pointer." This refers to storing the T1 data indicated by the T1 input pointer in the T1 section of computer data memory 116 into the output memory section of such computer memory at a location indicated by the output pointer. Step 170 also contains the commands "Decrement T1 input pointer" and "Decrement output pointer." After step 170 is completed the program returns back to the step 168 and continues to recycle until the output of step 168 is NO.

As shown in FIG. 5E after the "dump T2" step 132, the program advances to a step 172 which asks the question "Is there any remaining T2 data?" If the answer to this question is NO, then the program advances to "done." However, if the answer to the question of step 172 is YES, then the program advances to step 174 which contains the command "Store the T2 data indicated by T2 input pointer in the location indicated by the output pointer." This refers to transfer of the T2 data stored in the T2 memory section of the computer memory 116 and indicated by the T2 input pointer into the output memory section of the computer memory where it is stored at the location indicated by the output pointer. The step 174 also contains the two additional commands "Decrement T2 input pointer" and "Decrement output pointer." After step 174 is completed the program returns to step 172 and recycles until the answer to step 172 is NO, at which time the program advances to "done." This completes the computer program flow chart of FIGS. 5A to 5E for one embodiment of a computer program which may be stored in the program memory 114 for operation of the central processing unit 110 of the computer to reconstruct in the output memory section of the computer data memory 116 the digital data signal samples in their original time relationship and to display such reconstructed data on a suitable display device 120, such as a cathode ray tube.

Figure 6A:
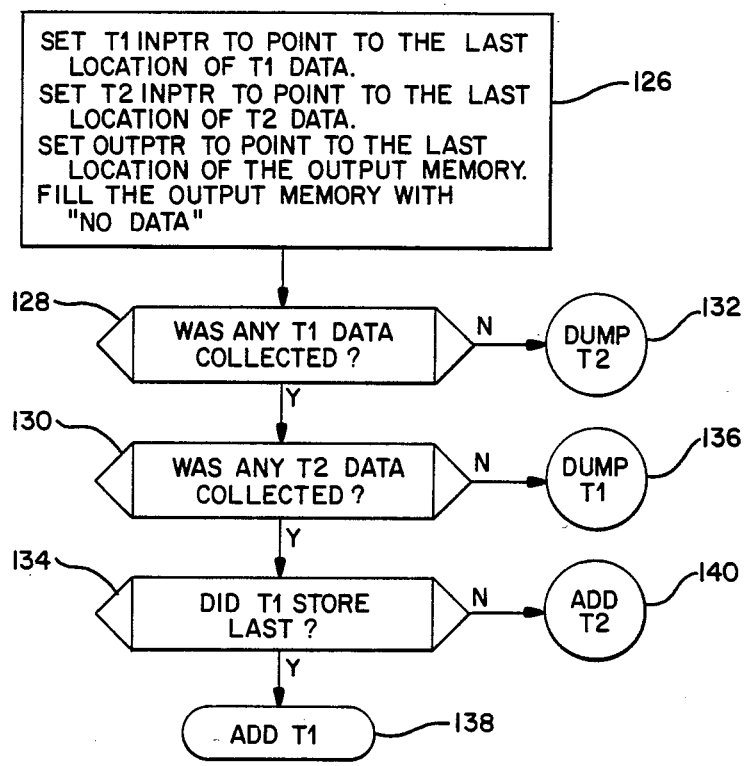
Figure 6B:
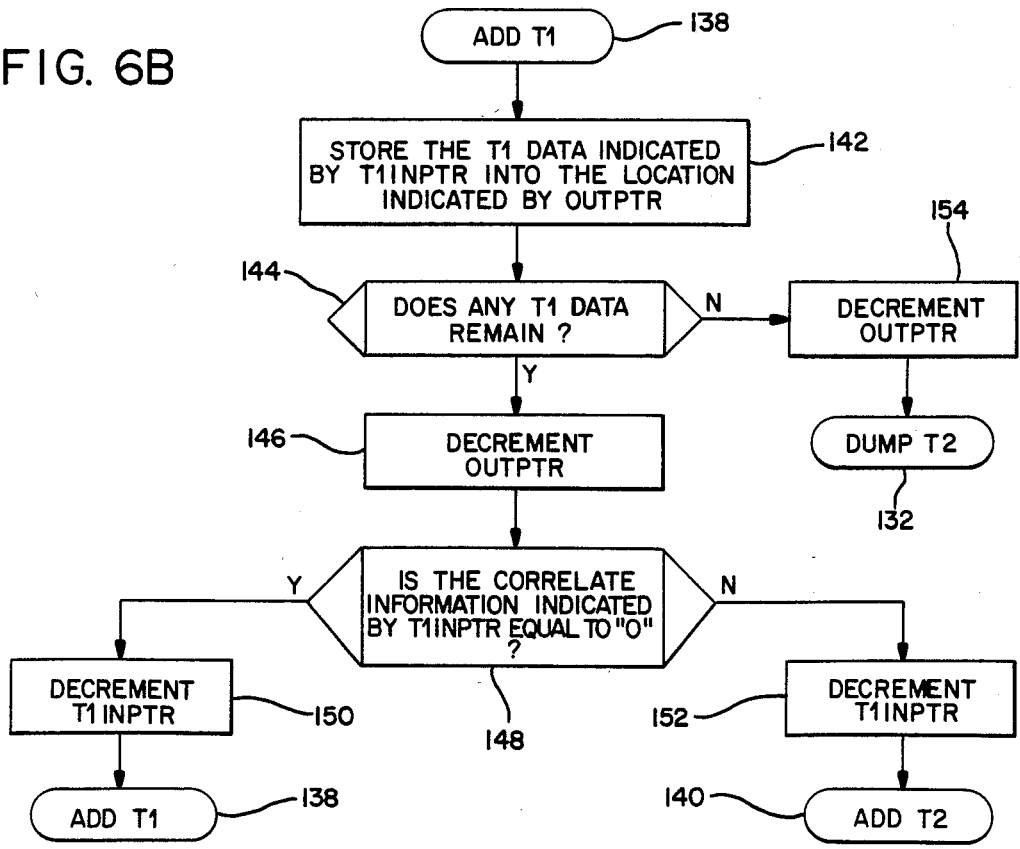
Figure 6C:
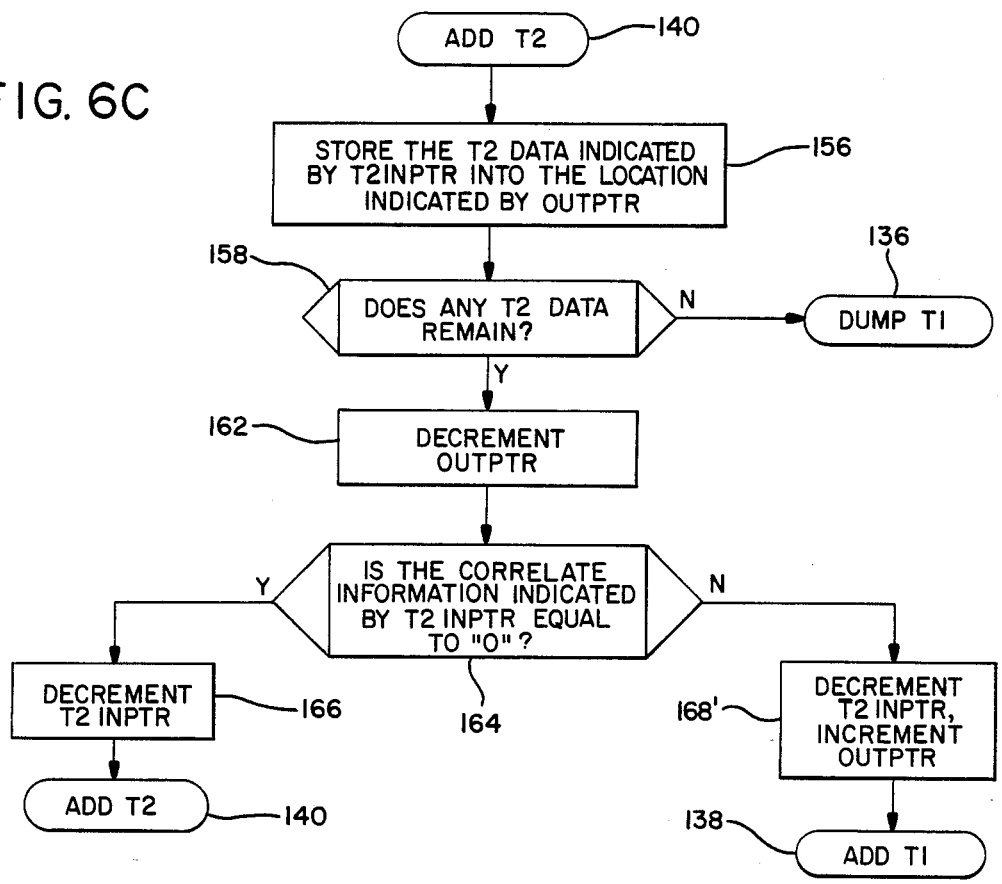
Figure 6D:
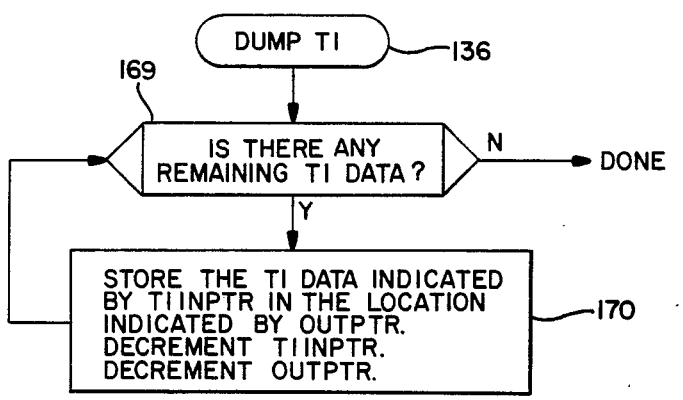
Figure 6E:
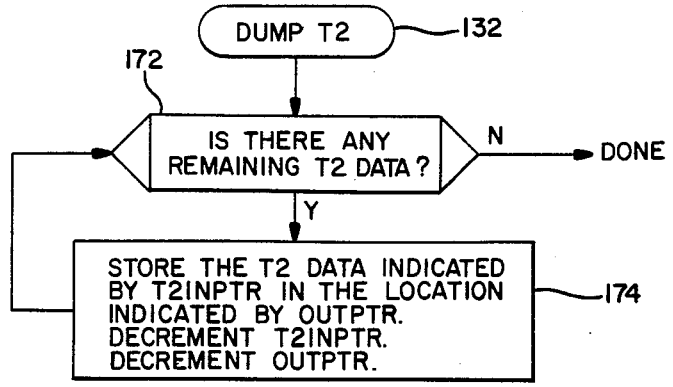

A modified computer program flow chart is shown in FIGS. 6A to 6E which is an improvement over, but is very similar to the computer program of FIGS. 5A to 5E so that only the changes between such flow charts will be described. There are two changes in the computer program flow chart of FIG. 6 over that of FIG. 5, and both of these changes are shown in FIG. 6C. The first change is that FIG. 6C differs from FIG. 5C by the elimination of the "decrement output pointer" step 160 so that the NO output of the step 158 proceeds directly to the "dump T1" step 136. The other change in FIG. 6C over that of FIG. 5C, is that the "decrement T1 output pointer" step 168 has been modified slightly by adding the additional command "increment output pointer" in step 168'. Modified step 168' is between the NO output of step 164 and the "add T1" step 138. The "increment output pointer" command refers to advancing the position of the output pointer forward one space. This is done at the same time the T2 input pointer is decremented or moved backward one space.

It will be obvious to one having ordinary skill in the art that many changes may be made in the above-described preferred embodiment of the invention. Therefore, the scope of the present invention should be determined from the following claims.

We claim:

1. A signal sampling system, comprising:
   first sampling means for sampling a first data signal when first sampling pulses are applied thereto to produce first data sample output signals;
   second sampling means for sampling a second data signal which may be the same as or different from said first data signal, when second sampling pulses of a different timebase than said first sampling pulses are applied thereto to produce second data sample output signals; and
   timebase correlation means for generating a first time correlation signal output corresponding to the first sampling pulses and a second time correlation signal output corresponding to the second sampling pulses;
   said first and second correlation signals each being produced by the correlation means with at least two different logic levels, including for the first correlation signal a first logic level if there is a sample pulse, and a second logic level if there is no sample pulse, of the second sampling pulses between the current and previous sample pulses of the first sampling pulses, and including for the second correlation signal a first logic level if there is a sampling pulse, and a second logic level if there is no sampling pulse, of the first sampling pulses between the current and previous sample pulses of the second sampling pulses.

2. A sampling system in accordance with claim 1 which also includes first memory means for storing the first data sample output signals of the first sampling means and the first correlation signal; and
   second memory means for storing the second data sample output signals of the second sampling means and the second correlation signal.

3. A sampling system in accordance with claim 2 which also includes clock pulse generation means for generating a first sampling clock signal and a second sampling clock signal to provide respectively said first and second sampling pulses, and for generating a first store clock signal and a second store clock signal of different timebases corresponding to said first and second sampling clock signals, said first and second store clock signals being applied to the timebase correlation means for producing said first and second correlation signals and being applied to said first and second memory means, respectively, to cause said first and second data sample signals and said first and second correlation signals to be stored therein.

4. A sampling system in accordance with claim 2 which also includes a signal reconstruction means connected to said first and second memory means for reconstructing the first and second data signals in proper time relationship from the first and second data sample output signals and the first and second correlation signals.

5. A sampling system in accordance with claim 1 in which the timebase correlation means produces a last clock pulse indicator signal indicating which of the first and second sampling pulses was last applied to said system.

6. A sampling system in accordance with claim 1 in which the first and second data signals are digital data signals.

7. A sampling system in accordance with claim 1 in which the timebase correlation means includes:
   a last clock pulse detector means for detecting the last previous clock pulse applied to said correlation means from first and second clock signals corresponding to the first sampling pulses and the second sampling pulses, and for producing first and second last clock pulse indicator signal outputs in response thereto, said second output being inverted with respect to said first output;
   first correlation sampler means for sampling said first output of said last clock detector means and for producing said first correlation signal in response thereto; and
   second correlation sampler means for sampling said second output of said last clock pulse detector means and for producing said second correlation signal in response thereto.

8. Digital signal sampling system, comprising:
   clock pulse generation means for generating a first sampling clock pulse signal and a second sampling clock pulse signal of different timebases, and for generating a first store clock pulse signal and a second store clock pulse signal of different timebases corresponding to said first and second sampling clock signals;
   first sampling means for sampling a first digital data signal when said first sampling clock pulses are applied thereto to produce first data sample output signals;
   second sampling means for sampling a second digital data signal when said second sampling clock pulses are applied thereto to produce second data sample output signals;
   timebase correlation means for generating a first time correlation signal output corresponding to the first store clock signal received at one input, and for generating a second time correlation signal output corresponding to the second store clock signal received at another input, and for generating a last clock indicator signal indicating which of said first and second store clock pulses was last applied thereto;
   said first and second correlation signals each being produced by the correlation means with different binary logic levels, including for the first correlation signal a "1" level if there is a clock pulse, and a "0" level if there is no clock pulse, of the second store clock signal between the current and previous clock pulses of the first store clock signal, and including for the second correlation signal a "1" level if there is a clock pulse, and a "0" level if there is no clock pulse, of the first store clock signal between the current and previous clock pulses of the second store clock signal;
   first memory means for storing the first data sample output signals of the first sampling means and the first correlation signal when the first store clock signal is applied thereto;
   second memory means for storing the second data sample output signals of the second sampling means and the second correlation signal when the second store clock signal is applied thereto; and
   signal reconstruction means for reconstructing the first and second data signals in proper time relationship from the first and second data sample output signals and the first and second correlation signals stored in said first and second memory means and from the last clock indicator signal produced by the correlation means.

9. A sampling system in accordance with claim 8 in which the timebase correlation means includes:
   a last clock pulse detector means for detecting the last previous clock pulse of the first store clock signal and the second store clock signal, and for producing first and second last clock pulse indicator signal outputs in response thereto, said second output being inverted with respect to said first output;
   first correlation sampler means for sampling said first output of said detector means and for producing said first time correlation signal in response thereto; and
   second correlation sampler means for sampling said second output of said detector means and for producing said second time correlation signal in response thereto.

10. A sampling system in accordance with claim 9 in which the last clock pulse detector means is a flip-flop circuit, said flip-flop having one input connected to the output of a first AND gate with one input of said first gate connected to the first correlation signal output of the first correlation sampler means and a second input of said first gate connected to a first store clock signal input of the timebase correlation means, and said flip-flop having a second input connected to the output of a second AND gate with one input of said second gate connected to the second correlation signal output of the second correlation sampler means and a second input of said second gate connected to a second store clock signal input of the timebase correlation means.

11. A sampling system in accordance with claim 10 which also includes a signal delay means connected between the second output of the last clock pulse detector flip-flop and the data input of the second correlation sampler means.

12. A sampling system in accordance with claim 10 which also includes a first buffer amplifier connected between the first store clock input of the timebase correlation means and the second input of said first gate, and a second buffer amplifier connected between the second store clock input of the timebase correlation means and the second input of said second gate.

13. A sampling system in accordance with claim 8 in which the clock pulse generation means includes a word recognizer means for generating a trigger signal output in response to the receipt of both a first trigger word in the first data signal and a second trigger word in the second data signal applied to said trigger word recognizer means.

14. A sampling system in accordance with claim 13 which also includes first sample counter means and second sample counter means, each connected at a counter enable input to said trigger signal output and at a count input to the outputs of the third and fourth AND gates, respectively, each AND gate having a first input connected to a store control signal output of the word recognizer means, having a second input connected to the terminal count output of its associated sample counter means, and having a third input connected to a respective one of said first and second sample clock signal inputs to produce the first store clock signal at the output of the fourth gate.

15. A sampling system in accordance with claim 8 in which the signal reconstruction means includes a digital computer means for producing the reconstructed data signals having a computer data memory into which the first and second data sample signals and the first and second correlation signals are transferred from said first and second memory means, and display means for displaying the reconstructed data signals.

16. A timebase correlation circuit, comprising:
input means for applying a first clock pulse signal to a first input of the correlation circuit, and for applying a second clock pulse signal to a second input of the correlation circuit;
last clock pulse detector means for detecting the last previous clock pulse of the first clock signal and the second clock signal, and for producing first and second last clock pulse indicator signal outputs in response thereto, said second output being inverted with respect to said first output;
first correlation sampler means for sampling said first output of said detector means and for producing a first time correlation signal in response thereto; and
second correlation sampler means for sampling a second output of said detector means and for producing a second time correlation signal in response thereto.

17. A circuit in accordance with claim 16 in which the first and second correlation sampler means produce the first and second correlation signals with different binary logic levels, including for the first correlation signal a "1" level if there is a clock pulse, and a "0" level if there is no clock pulse, of the second clock signal between the current and previous clock pulses of the first clock signal, and including for the second correlation signal a "1" level if there is a clock pulse, and a "0" level if there is no clock pulse, of the first clock signal between the current and previous clock pulses of the second clock signal.

18. A circuit in accordance with claim 16 in which the last clock pulse detector means is a flip-flop circuit, said flip-flop having one input connected to the output of a first AND gate and a second input connected to the output of a second AND gate, said first gate having one input connected to the first correlation signal output of the first correlation sampler means and having a second input connected to the first clock signal input, and said second gate having one input connected to the second correlation signal output of the second correlation sampler means and having a second input connected to the second clock signal input.

19. A circuit in accordance with claim 18 which also includes a signal delay means connected between the second output of the last pulse detector flip-flop and the data input of the second correlation sampler means, and in which the first and second correlation sampler means are both flip-flop circuits.

20. A circuit in accordance with claim 18 which also includes a first buffer amplifier connected between the first clock signal input and the second input of the first gate, and a second buffer amplifier connected between the second clock signal input and the second input of the second gate.

* * * * *